(12) United States Patent
Gong

(10) Patent No.: US 10,298,221 B2
(45) Date of Patent: May 21, 2019

(54) ADAPTIVE LEADING-EDGE BLANKING

(71) Applicant: Infineon Technologies Austria AG, Villach (AT)

(72) Inventor: Xiaowu Gong, Singapore (SG)

(73) Assignee: Infineon Technologies Austria AG, Villach (AT)

( * ) Notice: Subject to any disclaimer, the term of this patent is extended or adjusted under 35 U.S.C. 154(b) by 10 days.

(21) Appl. No.: 15/643,766

(22) Filed: Jul. 7, 2017

(65) Prior Publication Data
US 2019/0013803 A1 Jan. 10, 2019

(51) Int. Cl.
*H03K 5/1534* (2006.01)
*H03K 17/06* (2006.01)

(52) U.S. Cl.
CPC ......... *H03K 17/063* (2013.01); *H03K 5/1534* (2013.01)

(58) Field of Classification Search
CPC .... H03K 5/1534; H03K 17/06; H03K 17/063; H03K 17/08; H03K 17/082
USPC ........ 323/282; 327/322, 379, 380, 383, 384, 327/389
See application file for complete search history.

(56) References Cited

U.S. PATENT DOCUMENTS

| | | | |
|---|---|---|---|
| 5,418,410 A | 5/1995 | Tisinger | |
| 6,144,245 A | 11/2000 | Balogh | |
| 7,151,679 B2 | 12/2006 | Strijker | |
| 9,369,042 B1 | 6/2016 | Khayat | |
| 9,397,573 B2 | 7/2016 | Spini et al. | |
| 9,401,649 B2 | 7/2016 | Sasaki | |
| 9,490,712 B2 | 11/2016 | Chen et al. | |
| 9,654,014 B1 | 5/2017 | Gong | |
| 2005/0270807 A1 | 12/2005 | Strijker | |
| 2010/0007409 A1 | 1/2010 | Wang et al. | |
| 2013/0294118 A1* | 11/2013 | So ..................... | H02M 3/33507 363/21.16 |

* cited by examiner

*Primary Examiner* — William Hernandez
(74) *Attorney, Agent, or Firm* — Shumaker & Sieffert, P.A.

(57) ABSTRACT

In some examples, a control circuit is configured to control a transistor, and the control circuit includes a leading-edge detection unit configured to detect a time interval that corresponds to a leading-edge current spike through the transistor, wherein the time interval is independent of temperature. In some examples, the control circuit also includes a blanking unit configured to prevent the control circuit from turning off the transistor during the time interval.

20 Claims, 10 Drawing Sheets ns circuits.

ADAPTIVE LEADING-EDGE BLANKING

TECHNICAL FIELD

This disclosure relates to power electronics circuits.

BACKGROUND

A power electronics circuit may include a transistor configured to conduct electricity between an electrical load and a power source or a power sink. A current sensing circuit may be configured to monitor an electrical current through the transistor. When the current sensing circuit determines that the electrical current through the transistor exceeds a threshold amplitude, the power electronics circuit may be configured to turn off the transistor.

In some examples, just after the power electronics circuit turns on the transistor, the electrical current through the transistor may rapidly increase to a magnitude that exceeds the threshold amplitude. Shortly thereafter, the electrical current may decrease to a magnitude less than the threshold amplitude. The electrical current may then increase towards the threshold amplitude. The rapid current spike that can occur just after turning on the transistor may be known as a leading-edge current spike.

SUMMARY

This disclosure describes techniques for preventing the switching of the transistor just after turning on the transistor. A circuit including the transistor may also include a control circuit configured to turn on and turn off the transistor. The control circuit may include a leading-edge detection unit configured to detect a time interval that corresponds to a leading-edge current spike through the transistor. The time interval, as determined by the leading-edge detection unit, may be independent of temperature. The control circuit may also include a blanking unit configured to prevent switching of the transistor during the time interval.

In some examples, a control circuit is configured to control a transistor, and the control circuit includes a leading-edge detection unit configured to detect a time interval that corresponds to a leading-edge current spike through the transistor, wherein the time interval is independent of temperature. The control circuit also includes a blanking unit configured to prevent the control circuit from turning off the transistor during the time interval.

In some examples, a method includes detecting a time interval that corresponds to a leading-edge current spike through a transistor, wherein the time interval is independent of temperature. The method also includes refraining from turning off the transistor during the time interval.

In some examples, a power electronics system includes a transistor and a control circuit configured to control the transistor. The control circuit includes a leading-edge detection unit configured to detect a time interval that corresponds to a leading-edge current spike through the transistor, wherein the time interval is independent of temperature. The control circuit further includes a blanking unit configured to prevent the control circuit from turning off the transistor during the time interval.

The details of one or more examples are set forth in the accompanying drawings and the description below. Other features, objects, and advantages will be apparent from the description and drawings, and from the claims.

DETAILED DESCRIPTION

Figure 1:
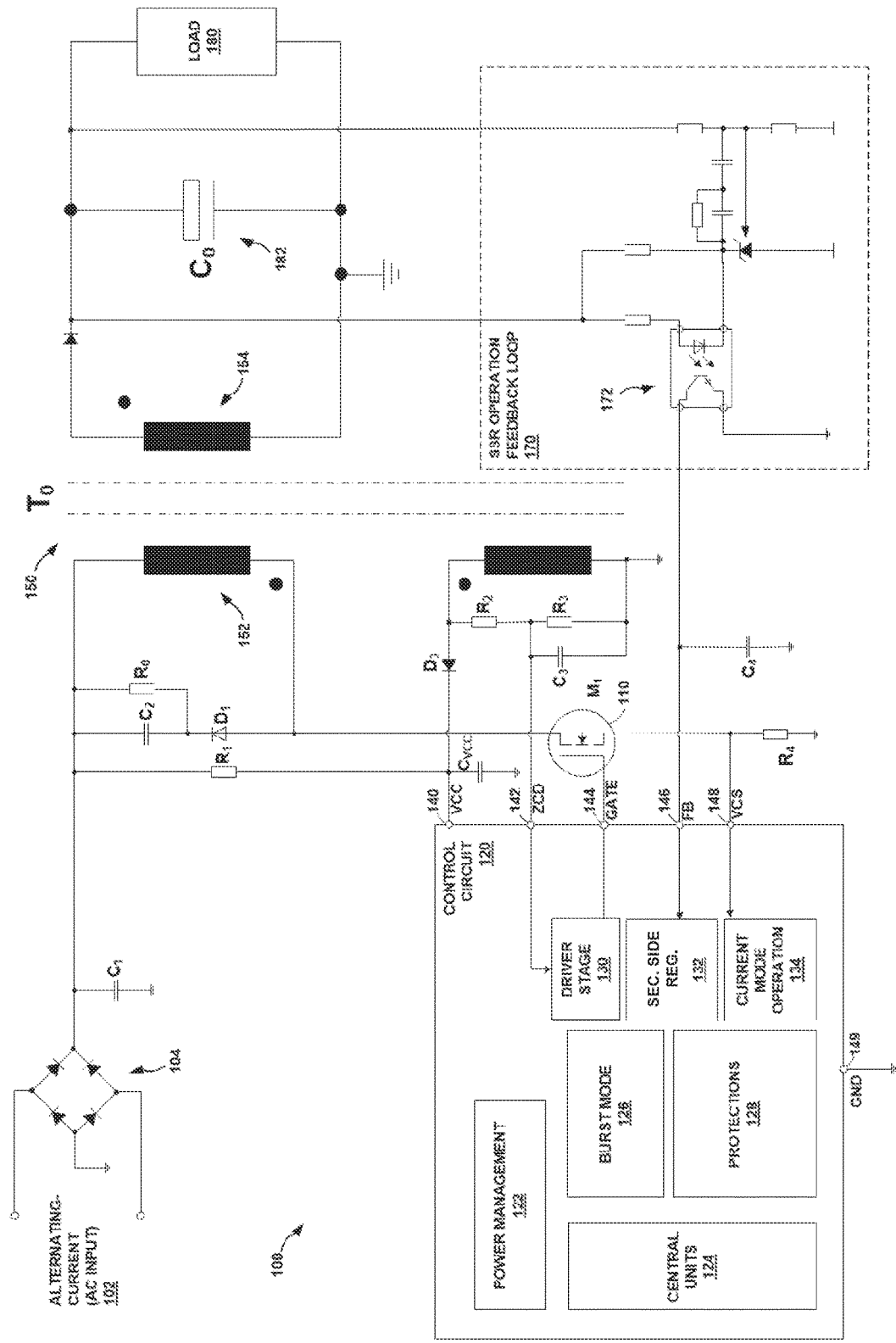
FIG. 1 is a conceptual block and circuit diagram of a system including a control circuit and a transistor, in accordance with some examples of this disclosure.

In general, a control circuit may be configured to turn off the transistor when an electrical current through the transistor exceeds a threshold amplitude. The control circuit may implement the threshold amplitude to ensure that the transistor conducts a desired amount of electrical charge during the on-time of the transistor. However, during the leading-edge current spike, the electrical current through the transistor may exceed the threshold amplitude, possibly causing the control circuit to turn off the transistor too early. Thus, it may be desirable to refrain from turning off the transistor during the leading-edge current spike so that the transistor can conduct the desired amount of electrical charge during the on-time of the transistor. If the control circuit prematurely turns off the transistor during the leading-edge current spike, the transistor may conduct an amount of electrical charge that is less than the desired amount.

This disclosure describes techniques for preventing the turning off of a transistor during a leading-edge current spike, which may be known as leading-edge blanking (LEB). The techniques may be independent of system processes and the operating temperature of the system by relying on the behavior of the transistor. In contrast, other systems may include capacitive timers and/or thresholds for electrical currents or voltages, which may fluctuate from device to device in the manufacturing process and may fluctuate based on temperature in the field.

In some examples, a leading-edge detection unit may be configured to track the rising phase and the falling phase of the leading-edge current spike using a capacitor. When the electrical current of the transistor increases again after the rising phase and the falling phase of the leading-edge current spike, the leading-edge detection unit may be configured to cause the blanking unit to refrain from preventing the control circuit from turning off the transistor. After the end of the time interval, the blanking unit may no longer prevent the control circuit from turning off the transistor.

As compared to other methods for LEB, the techniques of this disclosure may be independent of temperature tolerance and system processes. For example, a timer that relies on the charging of a capacitor may vary from device to device based on manufacturing processes because not all devices are built exactly the same. In addition, the operating temperature of the device may impact the operation of the timer. Another LEB device that could be effected by temperature and/or the manufacturing process is a device that implements a threshold amplitude of current or voltage to determine the end of the leading-edge current spike. In some examples, the threshold amplitude may vary from device to device based on the manufacturing process and based on the operating temperature when each device is in the field.

The techniques of this disclosure may allow detection of a time interval for the leading-edge current spike independent of temperature and manufacturing process. In some examples, a leading-edge detection unit may end the time interval when the electrical current through the transistor increases for a second time after being turned on. During the leading-edge current spike, the electrical current may increase and then decrease followed by a second increase. By tracking the direction of the change of the electrical current, rather than the amplitude of electrical current or the time duration of each phase, the leading-edge detection unit may adapt to the operation of the transistor independent of temperature and manufacturing process.

FIG. 1 is a conceptual block and circuit diagram of a system 100 including a control circuit 120 and a transistor 110, in accordance with some examples of this disclosure. System 100 is an example of a power electronics system that implements the techniques of this disclosure. However, the techniques of this disclosure may be implemented in any system with a transistor that may experience a leading-edge current spike. As depicted in FIG. 1, system 100 includes alternating-current (AC) input 102, rectification circuitry 104, transistor 110, control circuit 120, transformer 150, feedback loop 170, and electrical load 180. FIG. 1 depicts system 100 as including a flyback circuit. Additionally or alternatively, system 100 may include other power electronics circuitry, such as an AC-to-direct-current (AC/DC) conversion device, a DC/DC conversion device, a buck conversion circuit, a boost conversion circuit, a buck-boost conversion circuit, a forward conversion circuit, a resonant-mode conversion circuit, a half-bridge circuit, an H-bridge circuit, and/or any other conversion circuit.

Rectification circuitry 104 may be configured to receive and rectify AC electricity from AC input. Rectification circuitry 104 may also be configured to deliver the rectified AC electricity to primary winding 152, resistors $R_0$ and $R_1$, and capacitors $C_1$ and $C_2$. In some examples, the rectified AC electricity may include half-wave rectified electricity and/or full-wave rectified electricity. However, the techniques of this disclosure may also apply to systems configured to receive DC electricity at the input.

Transistor 110 may be a power switch such as, but not limited to, any type of field-effect transistor (FET), a bipolar junction transistor (BJT), an insulated-gate bipolar transistor (IGBT), a high-electron-mobility transistor (HEMT), a gallium-nitride (GaN) based transistor, or another element that uses voltage for its control. Transistor 110 may include an n-type transistor or a p-type transistor, and transistor 110 may be a power transistor. In some examples, transistor 110 may be a vertical transistor, a lateral transistor, and/or a horizontal transistor. In some examples, transistor 110 may include another analog device such as a diode and/or a thyristor. Transistor 110 may also include a freewheeling diode connected in parallel with a transistor to prevent reverse breakdown of transistor 110.

Transistor 110 may include three terminals: two load terminals and a control terminal. For a MOSFET switch, transistor 110 may include a drain terminal, a source terminal, and at least one gate terminal, where the control terminal is a gate terminal. For BJT switches, control terminals may be base terminals. Current may flow between the load terminals of transistor 110, based on the voltage at the control terminal.

Transistor 110 may include various material compounds, such as silicon (Si), silicon carbide (SiC), Gallium Nitride (GaN), or any other combination of one or more semiconductor materials. To take advantage of higher power density requirements in some circuits, power converters may operate at higher frequencies. In some examples, silicon carbide switches may experience lower switching power losses. Improvements in magnetics and faster switching, such as Gallium Nitride switches, may support higher frequency converters. These higher frequency circuits may require control signals to be sent with more precise timing, as compared to lower-frequency circuits. In some examples, system 100 may be configured to operate at switching frequencies of one hundred kilohertz, two hundred kilohertz, fifty kilohertz, and/or any other suitable frequency.

Control circuit 120 is configured to control the operations of transistor 110 by delivering control signals from driver stage circuitry 130 through gate node 144 to a control terminal of transistor 110. Control circuit 120 may be configured to configured to deliver control signals to the control terminal of transistor 110 to control the flow of electricity between the load terminals of transistor 110. The control signals delivered by control circuit 120 from driver stage circuitry 130 through gate node 144 may be square waveforms with an enabling period and a non-enabling period. The enabling period of a control signal, for example, may be the period of time during which the control signal enables a respective switch to conduct electricity between the load terminals of the respective switch. A controller may be configured to deliver and sustain an enabling control signal until the voltage at VCS node 148 exceeds a threshold voltage amplitude. Control circuit 120 may be configured to use current-mode control to supply an appropriate amount of electrical power to electrical load 180 on a cycle-by-cycle basis, where each cycle may include turning on and turning off transistor 110.

Control circuit 120 includes power management circuitry 122, central unit circuitry 124, burst mode circuitry 126, protection circuitry 128, driver stage circuitry 130, secondary side regulation (SSR) circuitry 132, and current mode operation circuitry 134. Control circuit 120 also includes power supply (VCC) node 140, zero-cross detection (ZCD) node 142, gate node 144, feedback (FB) node 146, voltage of current sense (VCS) node 148, and reference voltage (e.g., ground (GND)) node 149. Driver stage circuitry 130 may be configured to turn on transistor 110 by starting an enabling control signal and turn off transistor 110 by stopping an enabling control signal.

Current mode operation circuitry 134 may include a leading-edge detection unit configured to detect a time interval that corresponds to a leading-edge current spike through transistor 110. The leading-edge detection unit may be configured to detect the time interval corresponding to the leading-edge current spike by monitoring the voltage level at VCS node 148. The voltage at VCS node 148 may be proportional to the electrical current through transistor 110 and the resistance of a shunt resistor (e.g., resistor R), based on Ohm's Law. Current mode operation circuitry 134 may also include a blanking unit configured to prevent driver stage circuitry 130 from turning off transistor 110. For example, even if the voltage level at VCS node 148 (e.g., a shunt voltage across resistor $R_4$) exceeds a threshold amplitude, the blanking unit may be configured to prevent driver stage circuitry 130 from turning off transistor 110 during a time interval corresponding to a leading-edge current spike through transistor 110.

Driver stage circuitry 130 may generally be configured to continue delivering enabling control signals to transistor 110 after turning on transistor 110 until the electrical current through transistor 110 exceeds a threshold amplitude. Current mode operation circuitry 134 may be configured to determine that the electrical current exceeds a threshold amplitude by determining that the voltage level at VCS node 148 exceeds a threshold amplitude. However, the blanking unit may be configured to cause driver stage circuitry 130 to continue delivering enabling control signals to transistor 110 during the time interval to cause transistor 110 to remain on, even if the voltage level at VCS node 148 exceeds a threshold amplitude. During the time interval, the blanking unit may be configured to disable the turning off of transistor 110, refrain from turning off transistor 110, and/or cause transistor 110 to remain on. The blanking unit may also be configured to mask a signal from current mode operation circuitry 134 to driver stage circuitry 130 that could cause driver stage circuitry 130 to turn off transistor 110.

Transformer 150 may include primary-side winding 152 and secondary-side winding 154. Transformer 150 and optocoupler 172 may provide galvanic isolation between the primary side of system 100 and the secondary side of system 100. The primary side of system 100 includes transistor 110, control circuit 120, and primary winding 152. The secondary side of system 100 includes secondary winding 152, SSR operation feedback loop 170, electrical load 180, and output capacitor 182.

Figure 2:
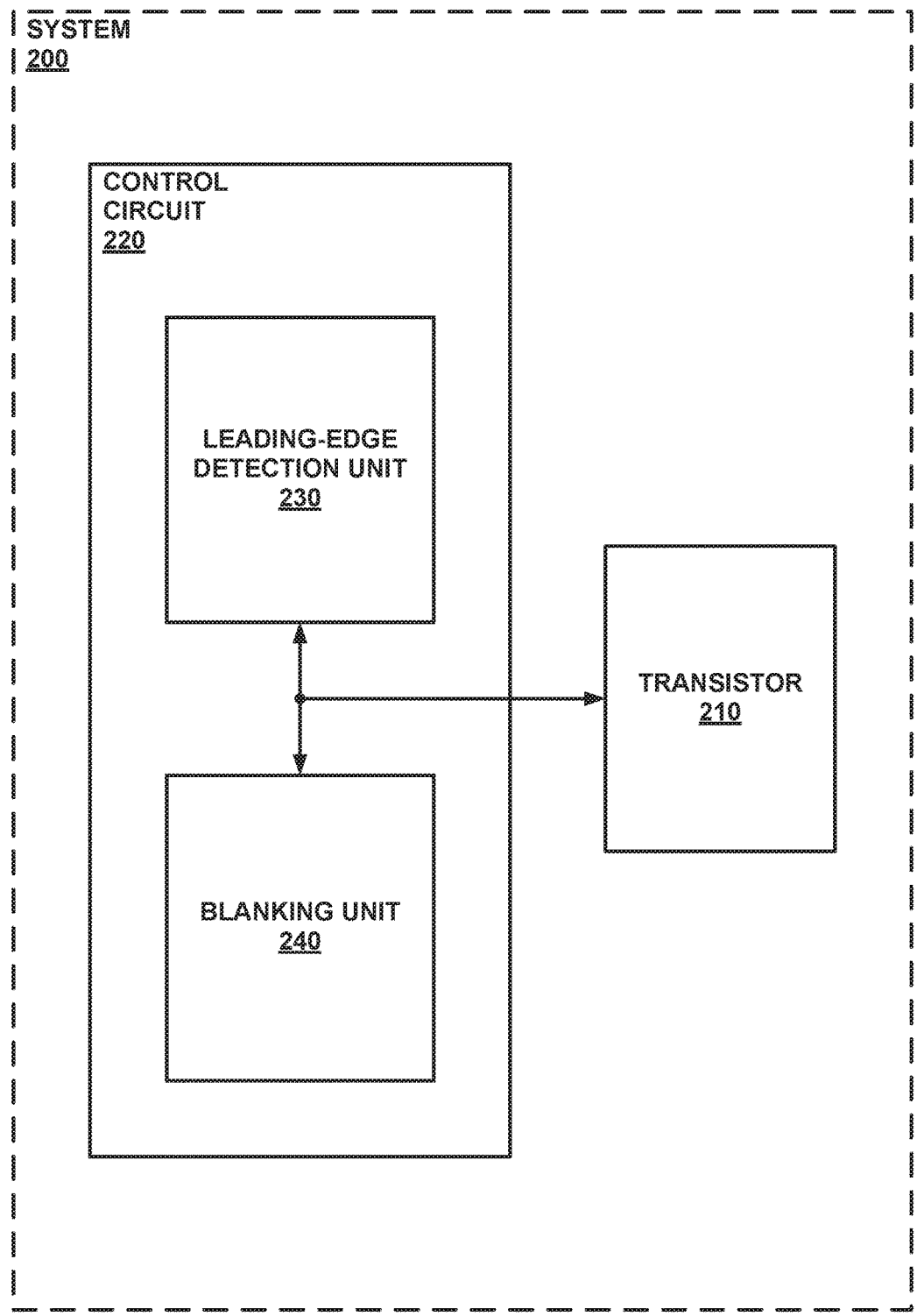
FIG. 2 is a conceptual block diagram of a control circuit configured to control a transistor, in accordance with some examples of this disclosure.

FIG. 2 is a conceptual block diagram of a control circuit 220 configured to control a transistor 210, in accordance with some examples of this disclosure. Leading-edge detection unit 230 is configured to detect a time interval that corresponds to a leading-edge current spike through transistor 210. As determined by leading-edge detection unit 230, the time interval may be independent of temperature, such that the temperature of transistor 210 and/or the temperature of control circuit 220 may not materially alter the circuitry by which leading-edge detection unit 230 determines the time interval.

Leading-edge detection unit 230 may be configured to detect the time interval by starting a timer when control circuit 220 turns on transistor 210. Leading-edge detection unit 230 may be configured to stop the timer at the earlier of (1) a predetermined time duration and (2) when the electrical current through transistor 210 increases a second time after turning on. The predetermined time duration may be chosen by a designer to be longer than an expected time duration of a leading-edge current spike but shorter than a desired on-time for transistor 210. By implementing the predetermined time duration, leading-edge detection unit 230 may avoid detecting an unreasonably long time interval when there is no leading-edge current spike.

Generally, a leading-edge current spike may include a single rising phase and a single falling phase. In some examples, the leading-edge current spike may include more than one rising phase or more than one falling phase. During the rising phase, the electrical current through transistor 210 increases. Leading-edge detection unit 230 may be configured to detect the rising phase by monitoring the voltage level across a shunt resistor electrically connected in series with transistor 210, which may be referred to as a "shunt voltage." After the rising phase and during the falling phase, the electrical current through transistor 210 decreases. An example leading-edge current spike may conclude at the end of the falling phase when the electrical current through transistor 210 begins increasing for a second time.

Blanking unit 240 may be configured to cause control circuit 220 to continue delivering an enabling signal to transistor 210 during the time interval. The interval time may also be called a blanking time interval or a leading-edge blanking time interval. Blanking unit 240 may be configured to prevent control circuit 220 from turning off transistor 210. Additionally or alternatively, blanking unit 240 may be configured to disable control circuit 220 from turning off of transistor 210.

Figure 3:
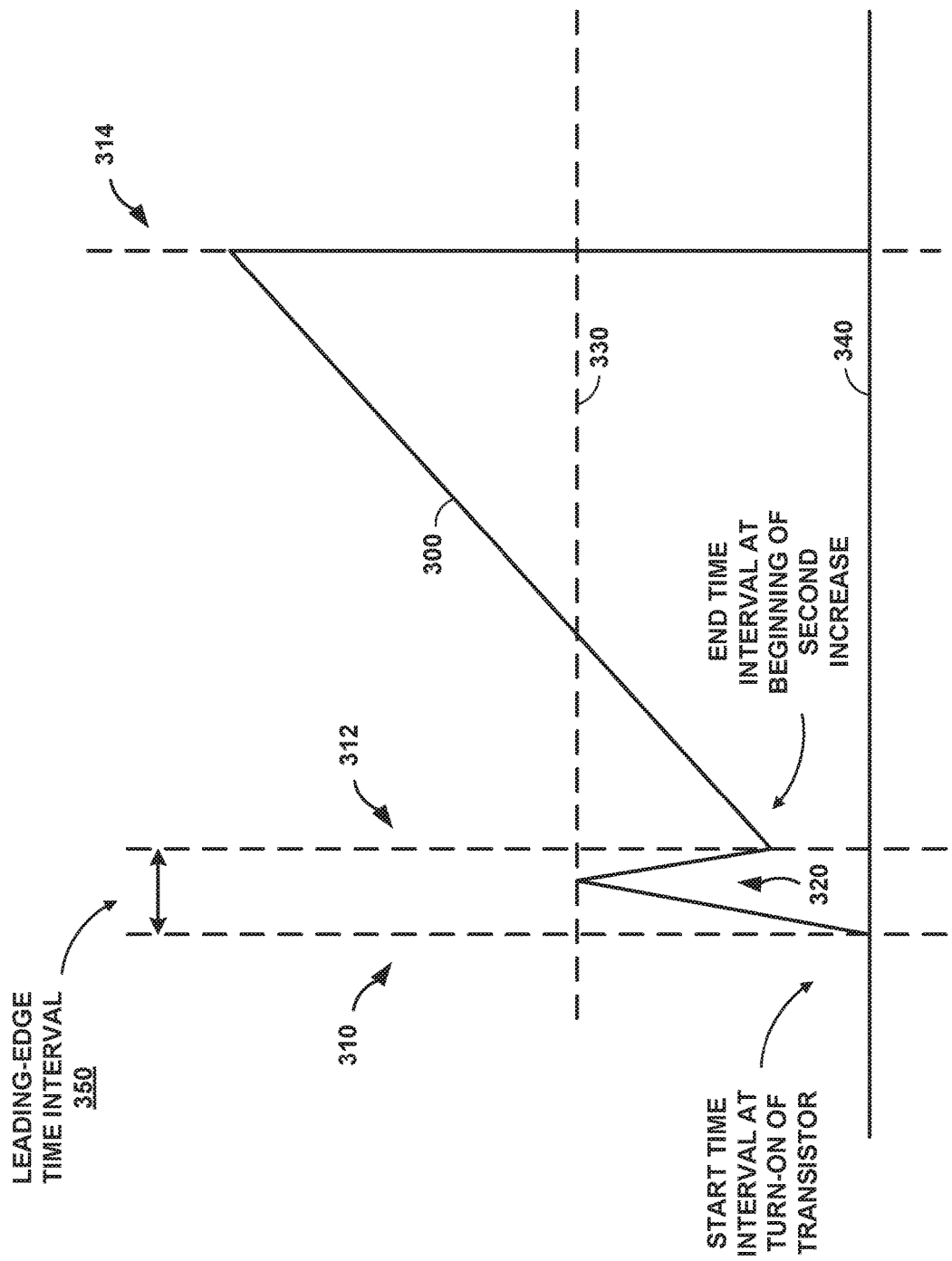
FIG. 3 is a timing diagram of a leading-edge current spike through a transistor, in accordance with some examples of this disclosure.

FIG. 3 is a timing diagram of a leading-edge current spike 320 through a transistor, in accordance with some examples of this disclosure. The horizontal axis of the diagram in FIG. 3 represents time. The vertical axis of the diagram in FIG. 3 may represent the amplitude of electrical current 300 through the transistor or the amplitude of a shunt voltage, which may be proportional to the amplitude of electrical current 300.

At approximately time 310, a control circuit may turn on the transistor, causing electrical current 300 through the transistor to increase from baseline amplitude 340, which may be at or near zero. The increase of electrical current 300 during leading-edge time interval 350 may be known as the rising phase of leading-edge current spike 320. A leading-edge detection unit may be configured to start leading-edge time interval 350 when the transistor is turned on, or shortly thereafter due to propagation delay through circuitry of the leading-edge detection unit. During a falling phase of leading-edge current spike 320, electrical current 300 may decrease. At time 312, electrical current 300 may begin to increase again. At time 314, the control circuit may turn off the transistor, causing electrical current 300 to decrease to baseline amplitude 340.

The control circuit may be configured to detect leading-edge time interval 350 by starting a timer at time 310 when the control circuit turns on the transistor. The control circuit may be configured to end leading-edge time interval 350 at time 312 at the end of the falling phase of leading-edge current spike 320. The control circuit may be configured to determine the end of the falling phase by detecting a second increase in electrical current 300 after turning on the transistor.

During leading-edge current spike 320, electrical current 300 may reach or exceed amplitude 330. The control circuit may be configured to turn off the transistor when electrical current 300 exceeds a threshold amplitude that is higher than amplitude 330. In some examples, amplitude 330 may equal or exceed the threshold amplitude (e.g., the amplitude at time 314). However, a control circuit of this disclosure may include a blanking unit that prevents the control circuit from turning off the transistor during leading-edge current spike 320, even if electrical current through the transistor during leading-edge current spike 320 exceeds the threshold amplitude. The control circuit may continue to deliver enabling control signals to the transistor during leading-edge current spike 320 to cause the transistor to remain on.

Leading-edge current spike 320 may result from the inherent, stray, and/or parasitic capacitance within the control circuit, an actual capacitance of the system, and/or the capacitance of the transistor. If the control circuit does not filter out leading-edge current spike 320, the control circuit may attempt to turn off the transistor, due to the excessive detected current during leading-edge current spike 320. The techniques of this disclosure may adaptively measure and detect leading-edge time interval 350. In some examples, these techniques may only depend on system parameters and not depend on the processes of the circuitry or temperature.

Figure 4:
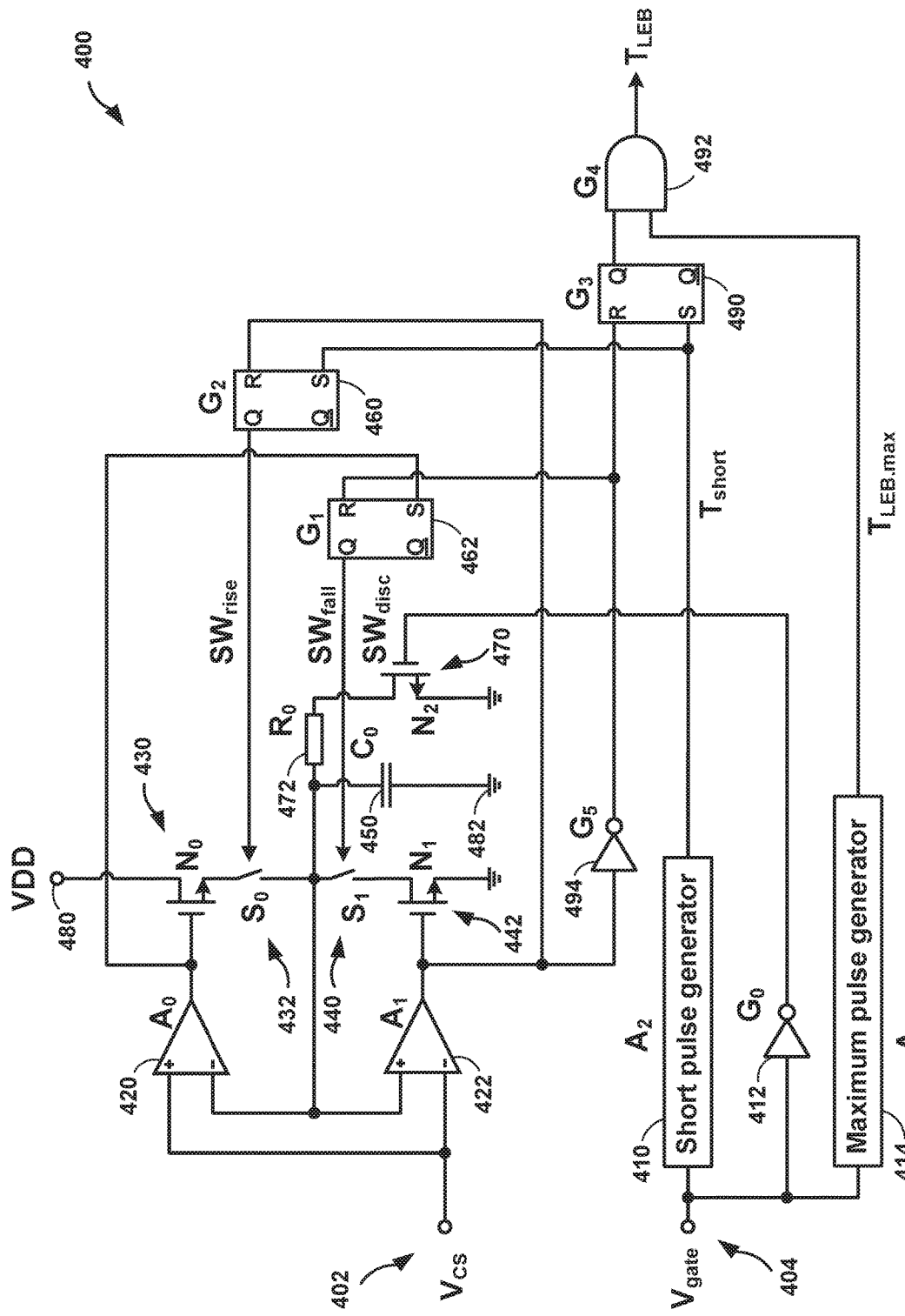
FIG. 4 is a circuit diagram of a leading-edge detection unit, in accordance with some examples of this disclosure.

FIG. 4 is a circuit diagram of a leading-edge detection unit 400, in accordance with some examples of this disclosure. Leading-edge detection unit 400 is one example of a leading-edge detection unit of this disclosure. Other examples of leading-edge detection units may include more or fewer components and/or a different arrangement of components. Leading-edge detection unit 400 may be configured to detect a time interval ($T_{LEB}$) that corresponds to a leading-edge current spike through a transistor (not shown in FIG. 4) controlled by a control circuit.

Leading-edge detection unit 400 may be configured to start the time interval when the control circuit turns on the transistor because the voltage level on input node 404 may increase. Leading-edge detection unit 400 may be configured to start the time interval in response to the control circuit turning on the transistor, such that there is a delay between the turn-on time and the start of the time interval. The delay may be caused by propagation delay for the circuitry of leading-edge detection unit 400. The propagation delay may cause the time interval to start (e.g., when the output of logic device 492 changes) ten nanoseconds, twenty nanoseconds, thirty nanoseconds, or any other time delay after a change in the voltage level of input node 404.

The increased voltage level of input node 404 may cause pulse generators 410 and 414 to deliver enabling signals to logic devices 490 and 492. Leading-edge detection unit 400 may be configured to end the time interval when pulse generator stops delivering an enabling signal to logic device 492 or when logic device 494 stops delivering a disabling signal to the reset node of logic device 490, whichever occurs earlier. Logic device 494 may stop delivering a disabling signal to the reset node of logic device 490 when the electrical current through the transistor increases after the leading-edge current spike.

Leading-edge detection unit 400 receives a signal indicating the electrical current through a transistor at input node 402 ($V_{CS}$). Input node 402 may receive a voltage signal from a node connected to a load terminal of the transistor. Leading-edge detection unit 400 also receives a signal indicating the voltage at the control terminal of the transistor at input node 404 ($V_{gate}$). The voltage at the control terminal of the transistor and the voltage at input node 404 may be at or near zero when the transistor is turned off.

When the control circuit turns on the transistor, the voltage at input node 404 may increase to an amplitude that causes short pulse generator 410 ($A_2$) and maximum pulse generator 414 ($A_3$) to generate respective pulses ($T_{short}$ and $T_{LEB.max}$) and causes logic device 412 ($G_0$) to generate a disabling signal ($SW_{disc}$) to turn off discharge switch 470 ($N_2$). Each of pulse generators 410 and 414 may be configured to start a timer when the voltage level of input node 404 increases (e.g., when the control circuit turns on the transistor). Each of pulse generators 410 and 414 may be configured to stop the timer after a specific time duration. A designer may choose the specific time duration for pulse generator 410 to be long enough for a rising phase of the leading-edge current spike to begin after the turn-on of the transistor. The designer may choose the specific time duration for pulse generator 414 (e.g., the predetermined time duration) to be longer than an expected time duration for leading-edge current spikes. If the leading-edge current spike lasts longer than the predetermined time duration, logic device 492 may be configured to cause a blanking unit of the control circuit to refrain from preventing the control circuit from turning off the transistor after pulse generator 414 stops the timer and stops delivering an enabling signal to logic device 492.

When the control circuit turns off the transistor, the voltage level at input node 404 may decrease to an amplitude that causes logic device 412 to generate an enabling signal to turn on discharge switch 470 to discharge capacitor 450 ($C_O$) through resistor 472 ($R_O$). Discharge switch 470 may discharge capacitor 450 so that there is zero or nearly zero voltage potential across capacitor 450 when the control circuit turns on the transistor again.

During a rising phase of a leading-edge current spike, leading-edge detection unit 400 may be configured to charge capacitor 450. During the rising phase, the voltage level at input node 402 may increase, causing comparator 420 ($A_O$) to generate an enabling signal to cause switch 430 ($N_O$) to conduct electricity from high-side power supply 480 (VDD) to switch 432 ($S_O$). When the control circuit turns on the transistor, short pulse generator 410 may generate an enabling signal to cause logic device 460 ($G_2$) to deliver enabling signal ($SW_{rise}$) to switch 432. Thus, during the rising phase of a leading-edge current spike, switches 430 and 432 may conduct electricity from high-side power supply 480 to charge capacitor 450.

During the rising phase, comparator 422 ($A_1$) may generate a disabling signal to cause switch 442 ($N_1$) not to conduct electricity. If switch 442 does not conduct electricity, switch 442 may not discharge capacitor 450. At the beginning of the rising phase, short pulse generator 410 may cause logic device 490 ($G_3$) to deliver an enabling signal to logic device 492 ($G_4$). When logic device 492 receives enabling signals from both maximum pulse generator 414 and logic device 490, logic device 492 may generate an enabling signal to cause a blanking unit to prevent the control circuit from turning off the transistor. The time duration of the enabling signals generated by maximum pulse generator 414 may serve as a maximum time duration for the time interval ($T_{LEB}$) detected by leading-edge detection unit 400. Thus, leading-edge detection unit 400 may be configured to detect the time interval ($T_{LEB}$) of less than or equal to a predetermined time duration ($T_{LEB.max}$).

During the falling phase of a leading-edge current spike, the voltage level at input node 402 may decrease to less than the voltage level across capacitor 450. During the falling phase, comparator 420 may deliver a disabling signal to cause switch 430 to not conduct electricity from high-side power supply 480 to switch 432. Comparator 422 may deliver an enabling signal to cause switch 442 to conduct electricity from switch 440 ($S_1$) to low-side power supply 482. During the falling phase, comparator 420 may have delivered an enabling signal ($SW_{fall}$) to logic device 462 ($G_1$) to cause (e.g., set) logic device 462 to turn on switch 440 to cause switches 440 and 442 to discharge capacitor 450.

At the end of the falling phase of the leading-edge current spike, the electrical current through the transistor may begin increasing, causing the voltage level of input node 402 to begin increasing to an amplitude that is higher than the voltage level across capacitor 450. When the voltage level of input node 402 exceeds the voltage level across capacitor 450 after the leading-edge current spike, comparator 422 may deliver a disabling signal to logic device 494 ($G_S$) to cause logic device 494 to deliver an enabling signal to the reset node (R) of logic device 490. When the reset node of logic device 490 receives an enabling signal, logic device 490 may deliver a disabling signal to logic device 492 to cause logic device 492 to end the time interval.

In some examples, leading-edge detection unit 400, as part of a control circuit, may be configured to monitor a shunt voltage at input node 402 across a resistor electrically connected in series with a transistor controlled by the control circuit. Leading-edge detection unit 400 may be configured to charge capacitor 450 when the shunt voltage at input node 402 is greater than the voltage across capacitor 450 by causing comparator 420 and logic device 460 to deliver enabling signals to switches 430 and 432. Switches 430 and 432 may conduct electricity from high-side power supply 480 to accumulate charge on capacitor 450. Leading-edge detection unit 400 may be configured to discharge capacitor 450 when the shunt voltage at input node 402 is less than the voltage across capacitor 450 by causing comparator 422 and logic device 462 to deliver enabling signals to switches 440 and 442. Switches 440 and 442 may conduct electricity from capacitor 450 to low-side power supply 482 to remove charge from capacitor 450. When the shunt voltage at input node 402 is less than the voltage across capacitor 450, comparator 420 and logic device 460 may deliver enabling signals to switches 430 and 432 to stop charging capacitor 450. Leading-edge detection unit 400 may be configured to end the time interval when the shunt voltage at input node 402 is greater than the voltage across capacitor 450 after discharging capacitor 450. Comparator 422, through logic devices 490 and 494, may cause logic device 492 to end the time interval.

In some examples, comparators 420 and 422 may be configured to compare the shunt voltage at input node 402 and the voltage across capacitor 450 and generate an output signal based on comparing the shunt voltage and the voltage across capacitor 450. Comparators 420 and 422 may generate two or more output signals, such that comparator 420 and logic device 494 generate enabling signals when the shunt voltage exceeds the voltage across capacitor 450 and comparator 422 generates an enabling signal when the voltage across capacitor 450 exceeds the shunt voltage. Logic device 492 may be configured to start the time interval when the control circuit turns on the transistor based on enabling signals from pulse generators 410 and 414. Logic device 492 may be configured to end the time interval when the output signal from comparator 422, through logic devices 490 and 494, indicates that the shunt voltage is greater than the voltage across capacitor 450 after the falling phase.

In some examples, logic device 460 is configured to cause leading-edge detection unit 400 to begin charging capacitor 450 when the control circuit turns on the transistor. Logic device 460 may receive an enabling signal from short pulse generator 410 when the voltage level at input node 404 increases because the control circuit turns on the transistor. In response to receiving the enabling signal from short pulse generator 410, logic device 460 may deliver an enabling signal to switch 432 to conduct electricity from high-side power supply 480 to capacitor 450. Logic device 460 may be configured to cause leading-edge detection unit 400 to refrain from charging capacitor 450 when the output signal from comparator 422 indicates that the shunt voltage at input node 402 is less than the voltage across capacitor 450. The output signal from comparator 422 may cause logic device 460 to deliver a disabling signal to switch 432 when the shunt voltage is less than the voltage across capacitor 450.

Logic device 462 may be configured to cause leading-edge detection unit 400 to begin discharging capacitor 450 when the output signal from comparator 420 indicates that the shunt voltage is less than the voltage across capacitor 450. Logic device 462 may be configured to cause leading-edge detection unit 400 to refrain from discharging capacitor 450 when the output signal from comparator 422, through logic device 494, indicates that the shunt voltage is greater than the voltage across capacitor 450. Logic device 462 may control switch 440 to discharge capacitor 450 to low-side power supply 482 or refrain from discharging capacitor 450 based on the output signals from comparator 420 and 422.

In some examples, leading-edge detection unit 400, by pulse generator 410, comparator 420, and logic device 460, may be configured to turn on switches 430 and 432 to charge capacitor 450 during a rising phase of a leading-edge current spike. Leading-edge detection unit 400, by comparators 420 and 422 and logic device 460, may be configured to turn off switches 430 and 432 during a falling phase of the leading-edge current spike. Leading-edge detection unit 400, by comparator 422 and logic devices 462 and 494, may be configured to turn off switches 440 and 442 during the rising phase of the leading-edge current spike. Leading-edge detection unit 400, by comparators 420 and 422 and logic device 462, may be configured to turn on switches 440 and 442 during the falling phase. Leading-edge detection unit 400, by comparators 420 and 422 and logic devices 460, 462, and 494, may be configured to turn off switches 430, 432, 440, and 442 during a rising phase after the falling phase. The rising phase after the falling phase is a second rising phase that is outside of the leading-edge current spike. During the second rising phase, the electrical current through the transistor may increase at an approximately linear rate. When the electrical current reaches a threshold amplitude during the second rising phase, causing the control circuit to turn off the transistor.

In some examples, switches 430, 432, 440, 442, and 470 may include transistors, such as n-type transistors, or any other suitable device configured to conduct electricity based on a voltage signal delivered to a control terminal. Logic devices 412, 460, 462, 490, 492, and 494 may include flipflops, latches, AND gates, OR gates, NAND gates, NOR gates, inverters, and/or any other suitable devices. As depicted in FIG. 4, logic devices 412 and 494 are inverters, logic devices 460, 462, and 490 are set-reset latches, and logic device 494 is an AND gate.

Figure 5:
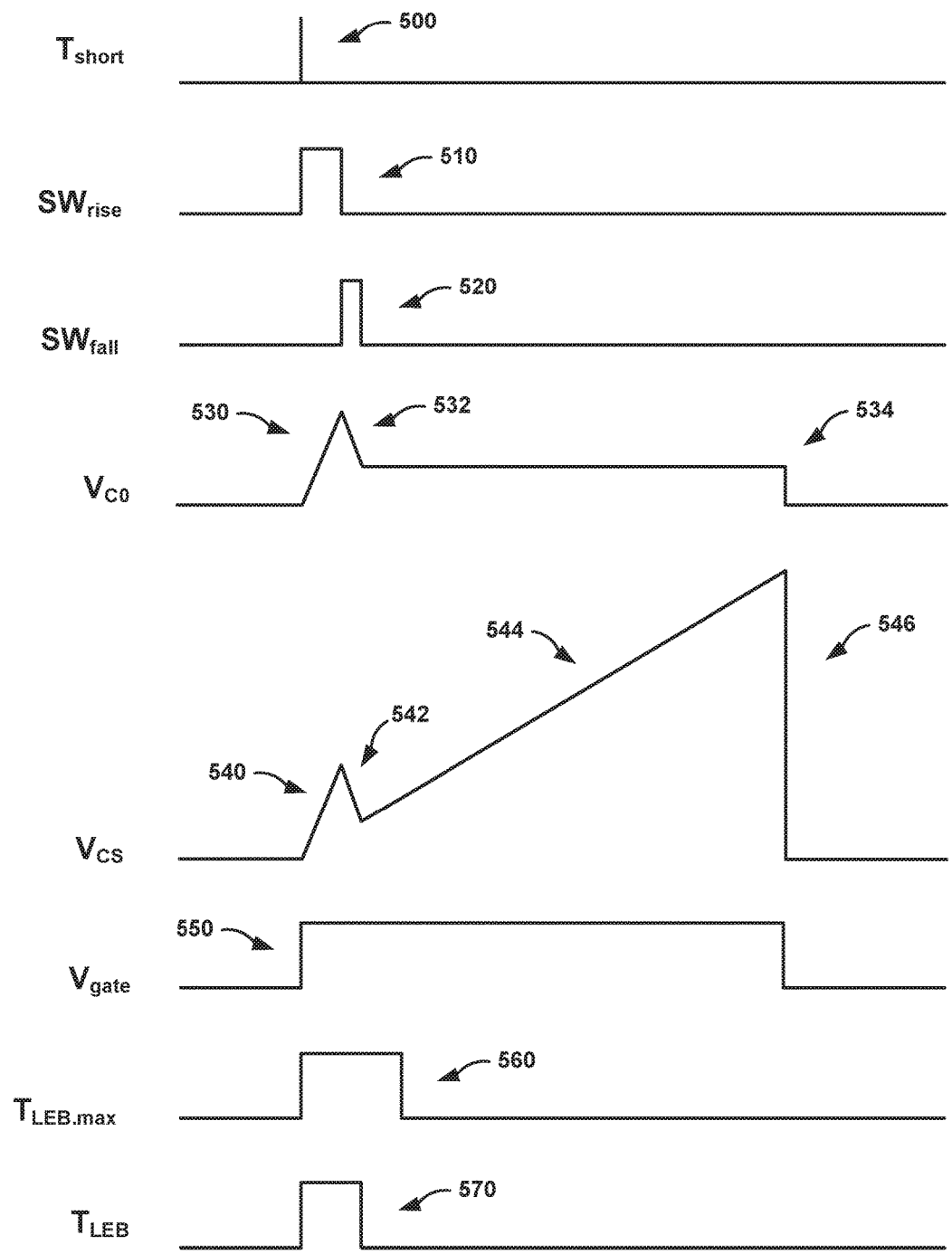
FIG. 5 illustrates timing diagrams for discontinuous current mode (DCM), in accordance with some examples of this disclosure.

FIG. 5 illustrates timing diagrams for discontinuous current mode (DCM), in accordance with some examples of this disclosure. A control circuit may turn on a transistor by delivering an enabling signal 550 ($V_{gate}$) to a control terminal of the transistor. Enabling signal 550 of FIG. 5 includes a square waveform. Enabling signal 550 may cause a leading-edge detection unit of the control circuit to generate short pulse 500 ($T_{short}$) and long pulse 560 ($T_{LEB.max}$). Short pulse 500 may cause the leading-edge detection unit to generate pulse 510 ($SW_{rise}$) to turn on a switch to charge a capacitor, as shown by rising voltage 530 across the capacitor ($V_{CS}$). Long pulse 560 may have a predetermined time duration and may operate as an upper limit on time interval 570 ($T_{LEB}$), as known as the LEB time.

After rising phase 540, the electrical current through the transistor may decrease during falling phase 542. The control circuit may monitor the shunt voltage ($V_{CS}$) across a resistor electrically connected in series with the transistor. Falling phase 542 may cause the leading-edge detection unit to end pulse 510 and start pulse 520 to turn on a switch to discharge the capacitor, as shown by falling voltage 532 across the capacitor. When the shunt voltage increases during a rising phase 544 after falling phase 542, the leading-edge detection unit may end pulse 520 to stop discharging the capacitor and stop time interval 570. The leading-edge detection unit may stop time interval 570 before the end of pulse 560. When enabling signal 550 ends, the shunt voltage may decline to zero at time 546, and the leading-edge detection unit may fully discharge the capacitor at time 534.

Figure 6:
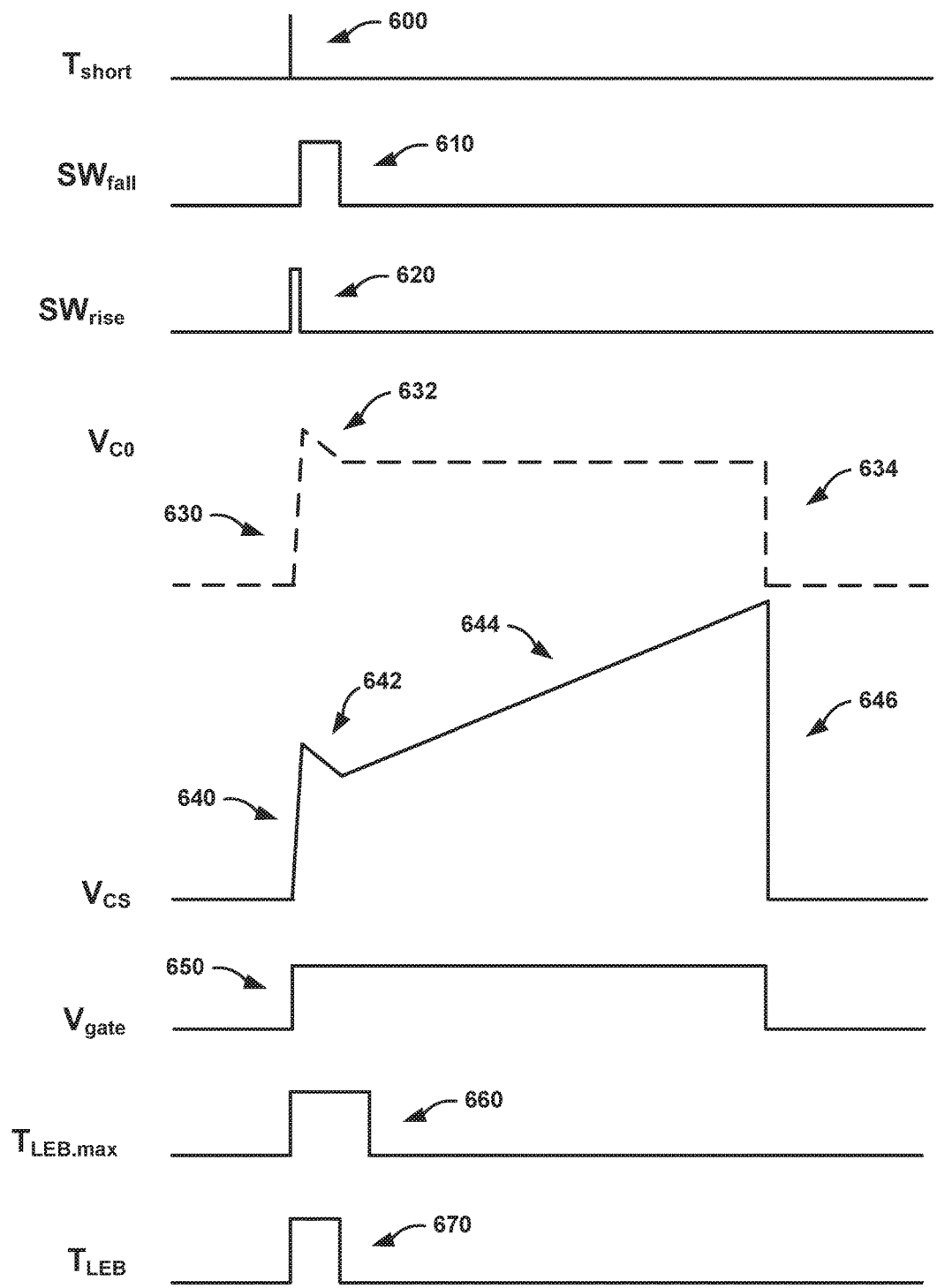
FIG. 6 illustrates timing diagrams for continuous current mode (CCM), in accordance with some examples of this disclosure.

FIG. 6 illustrates timing diagrams for continuous current mode (CCM), in accordance with some examples of this disclosure. A difference between the timing diagrams for DCM in FIG. 5 and the timing diagrams for CCM in FIG. 6 is the length of pulses 510, 520, 610, and 620. For example, the duration of pulse 510 may be relatively long compared to the duration of pulse 610 because the electrical current through the transistor may increase more rapidly during the rising phase for CCM. The duration of pulse 520 may be relatively short compared to the duration of pulse 620 because the electrical current through the transistor may decrease more rapidly during the falling phase for DCM.

Figure 7:
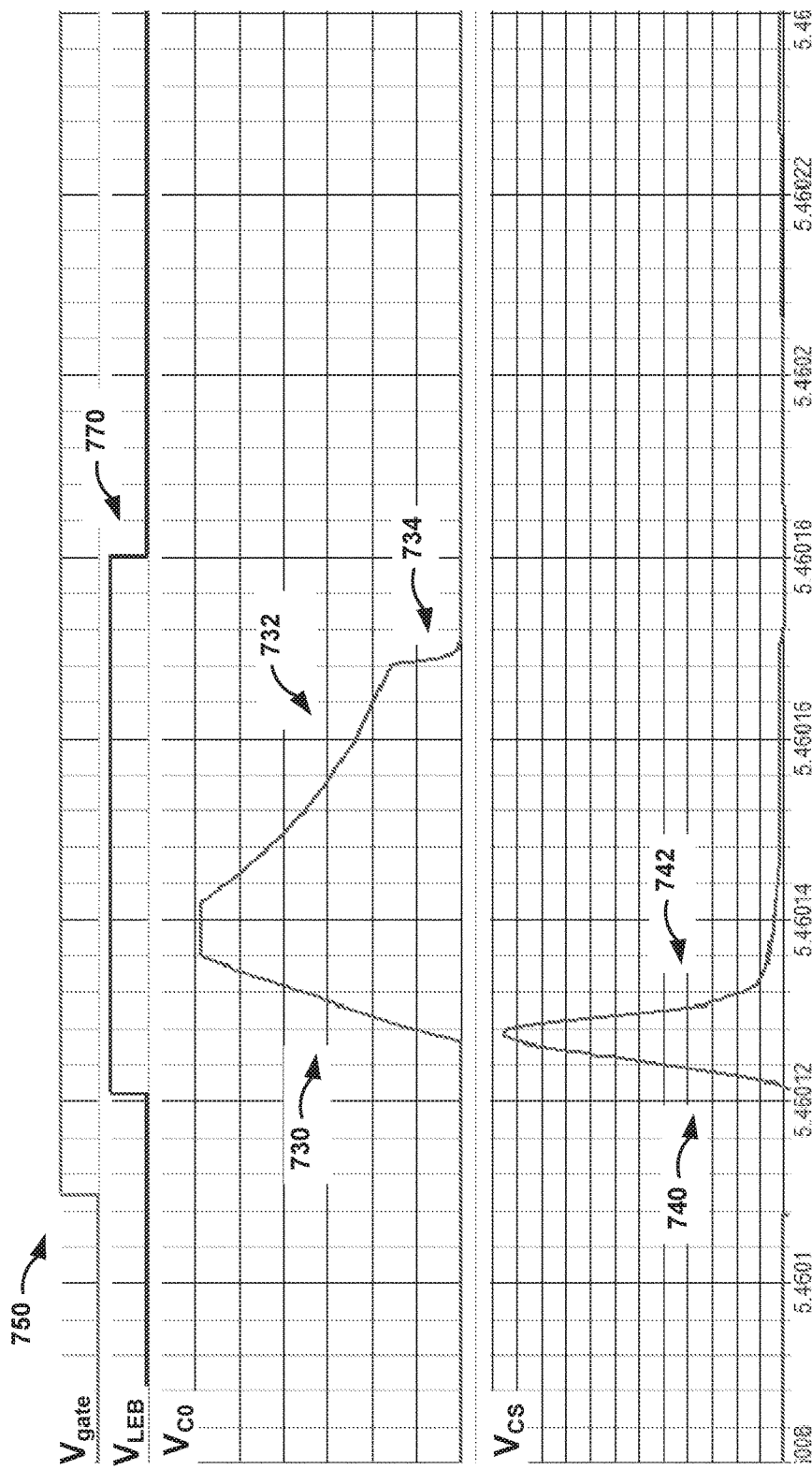
FIG. 7 illustrates a blanking time interval for DCM, in accordance with some examples of this disclosure.
Figure 8:
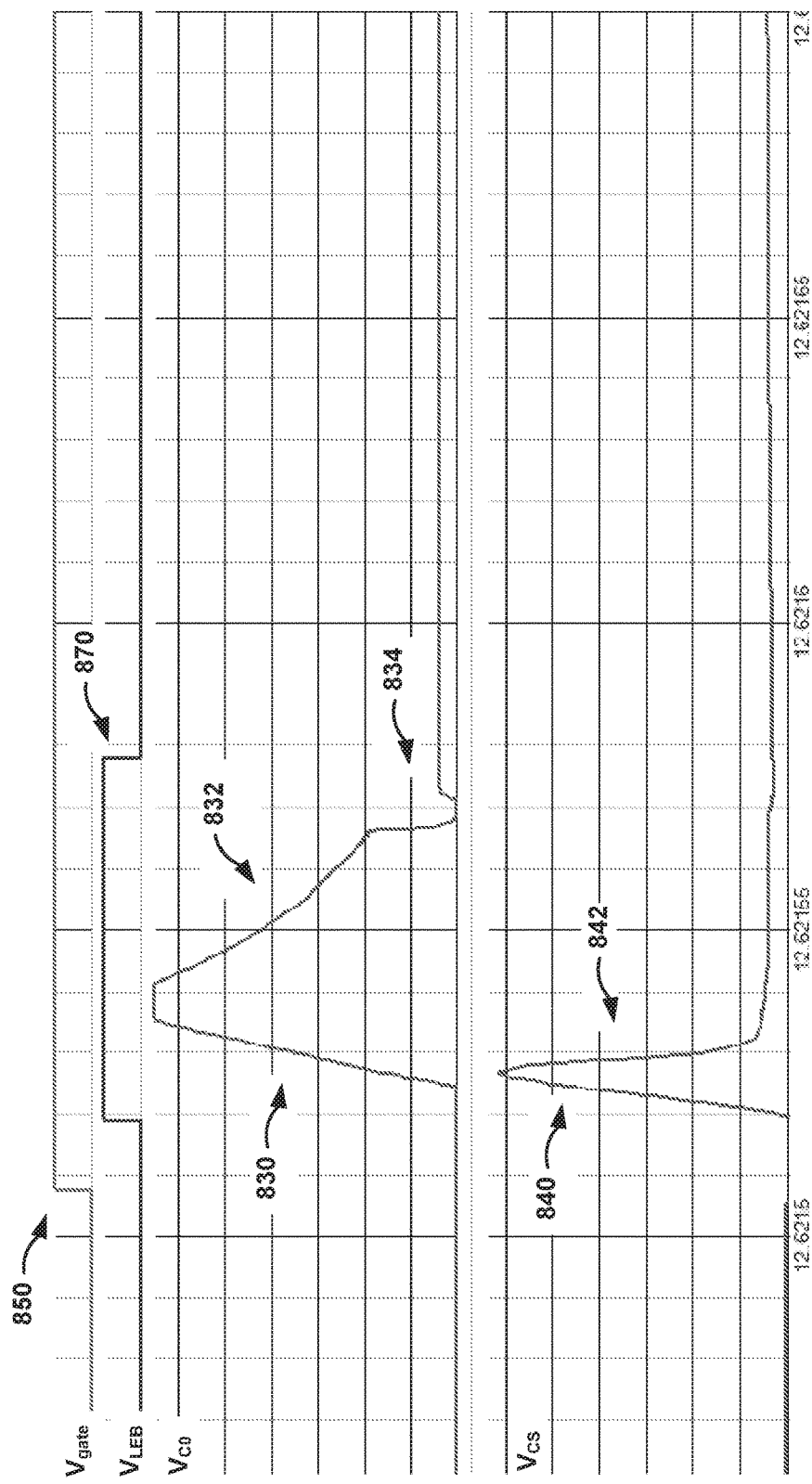
FIG. 8 illustrates a blanking time interval for CCM, in accordance with some examples of this disclosure.

FIG. 7 illustrates a blanking time interval 770 for DCM, in accordance with some examples of this disclosure. FIG. 8 illustrates a blanking time interval 870 for CCM, in accordance with some examples of this disclosure. FIGS. 7 and 8 include propagation delays for circuitry such as transistors, switches, comparators, logic devices, and/or pulse generators. For example, time interval 770 may begin after enabling signal 750, and time interval 870 may begin after enabling signal 850. In the examples of FIGS. 7 and 8, the propagation delay from enabling signals 750 and 850 to time intervals 770 and 870 may be approximately ten nanoseconds or twelve nanoseconds, where time interval 770 is approximately sixty nanoseconds, and time interval 870 is approximately fifty-five nanoseconds.

The leading-edge current spike including rising phase 740 and falling phase 742 has a duration of approximately ten nanoseconds or less. The leading-edge current spike including rising phase 840 and falling phase 842 has a duration of approximately twenty nanoseconds or less. In some examples, depending the application, the leading-edge current spike may have a duration of approximately two hundred nanoseconds. The leading-edge detection unit may continue charging and discharging a capacitor for approximately thirty nanoseconds after the end of the leading-edge current spike for DCM and CCM. The leading-edge detection unit may control the operations of the transistor using either peak-current control methods or controlled on-time methods, such as pulse-density modulation (PDM) and/or pulse-width modulation (PWM).

Figure 9:
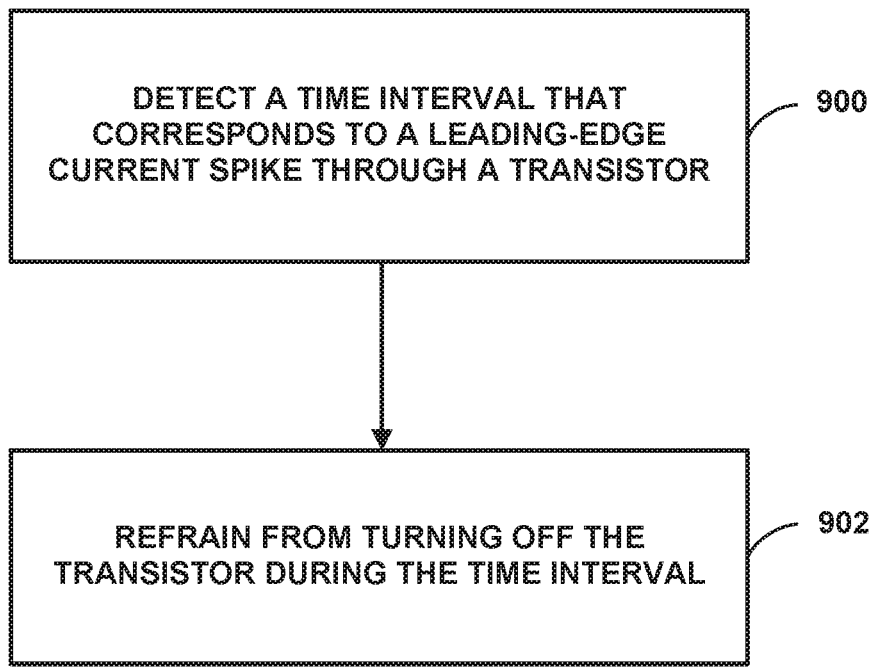
FIG. 9 is a flowchart illustrating example techniques for preventing the turn off of a transistor during a leading-edge current spike, in accordance with some examples of this disclosure.
Figure 10:
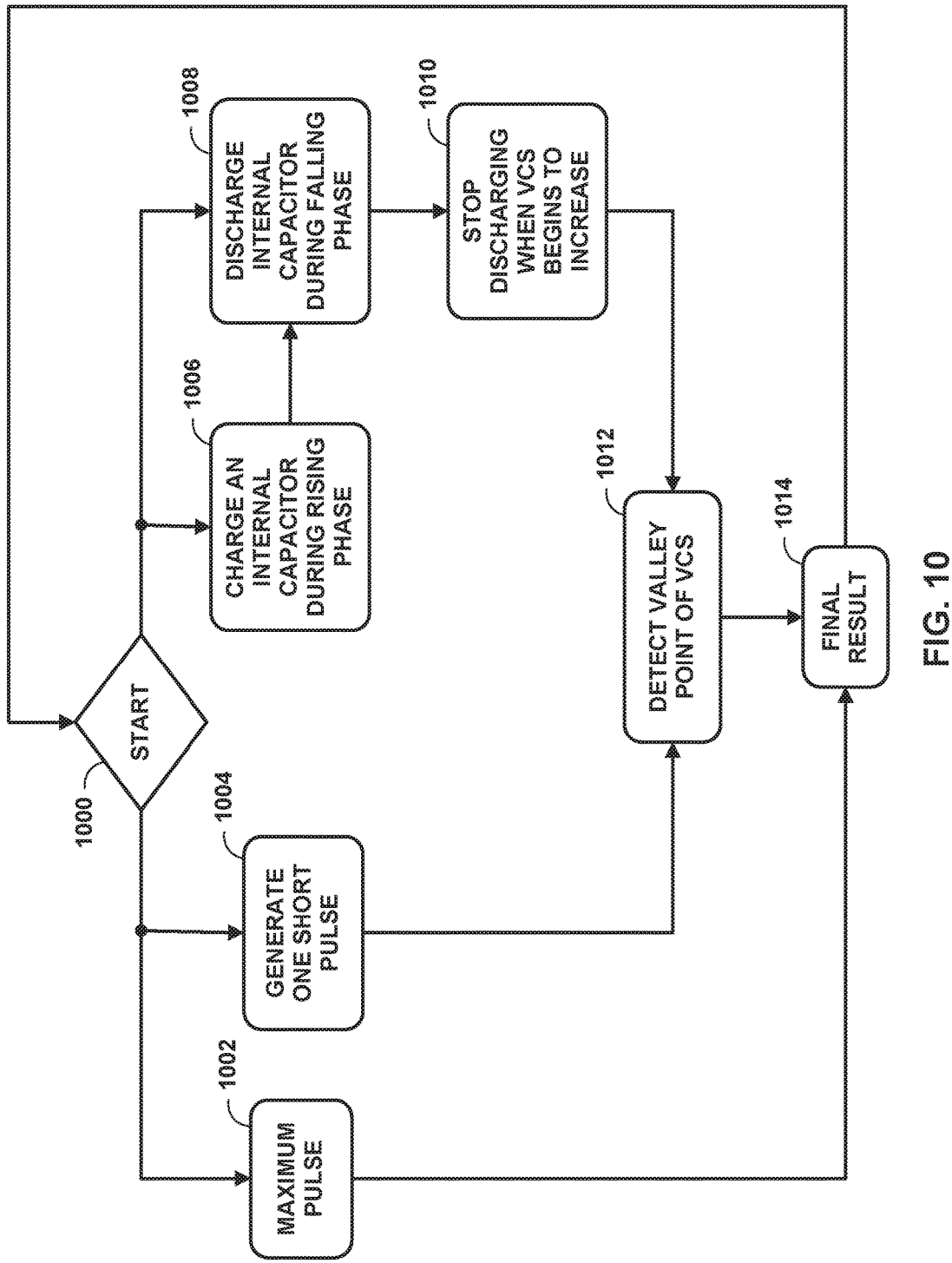
FIG. 10 is a flowchart illustrating example techniques for determining a blanking time interval, in accordance with some examples of this disclosure.

FIG. 9 is a flowchart illustrating example techniques for preventing the turn off of a transistor during a leading-edge current spike, in accordance with some examples of this disclosure. The techniques of FIGS. 9 and 10 are described with reference to control circuit 220 in FIG. 2, although other components, such as control circuit 120 and leading-edge detection unit 400 in FIGS. 1 and 4, may exemplify similar techniques.

In the example of FIG. 9, leading-edge detection unit 230 detects a time interval that corresponds to a leading-edge current spike through transistor 210, wherein the time interval is independent of temperature (900). Leading-edge detection unit 230 may be configured to start the time interval when control circuit 220 turns on transistor 210. Leading-edge detection unit 230 may be configured to end the time interval at the earlier of (1) a predetermine time duration and (2) a second increase in the electrical current through transistor 210. The leading-edge current spike through transistor 210 may include a rising phase followed by a falling phase. Therefore, the second increase in the electrical current may indicate the end of the leading-edge current spike.

In the example of FIG. 9, control circuit 220 refrains from turning off transistor 210 during the time interval (902). Blanking unit 240 may be configured to prevent control circuit 220 from turning off transistor 210 during the time interval. Blanking unit 240 may be configured to disable the turn-off circuitry of control circuit 220, and/or blanking unit 240 may be configured to cause control circuitry 220 to continue deliver an enabling control signal to transistor 210.

Another system may use only a timer to generate a preset time duration for a blanking unit. The preset time duration may sometimes be too short and sometimes too long, limiting the frequencies at which the timer can be used. The other system may not function well under low-load conditions and/or extreme temperatures. The timer of the other system may include current- or resistor-charging capacitor(s), which may depend on process variations and temperature coefficients. It may be desirable for a system to depend on the actual time duration of a leading-edge current spike, rather than a preset time duration.

Other systems may distinguish between low-impedance electrical loads and high-impedance electrical loads, such that the blanking time is longer for heavy loads and shorter for lighter loads. In such systems, the blanking time may depend on parasitic capacitance, such as the gate-source capacitance of a transistor, which may vary based on operating temperature and the manufacture process. In some examples, these other systems may only include two or three preset blanking time intervals from which the system may determine the blanking time interval.

Another system may include a current sensor to sense an magnitude of a gate current being delivered by a control circuit to the gate of a transistor. A comparator of this other system may indicate whether the sensed magnitude of the gate current exceeds a predetermined threshold current. A blanking circuit component, such as a switch connected to ground, may force the current sense signal to zero when the comparator indicates that the gate current of the transistor exceeds the threshold current. If the comparator determines that the gate current is less than the threshold current, the blanking circuit component may allow the value of the current sense signal to be determined by the current sensing circuitry. However, the gate driver circuit for the transistor may depend on process variations and temperature coefficients. In addition, the gate current of the transistor may not have a direct relationship with the time interval of a leading-edge current spike.

FIG. 10 is a flowchart illustrating example techniques for determining a blanking time interval, in accordance with some examples of this disclosure. In the example of FIG. 10, control circuit 220 starts a time interval by turning on transistor 210 (1000). In the example of FIG. 10, control circuit 220 generates a maximum pulse (e.g., a predetermined time duration) that functions an upper bound on the on the time interval (1002). In the example of FIG. 10, control circuit 220 also generates one short pulse to start the time interval and turn on a switch to charge a capacitor (1004). The rising edge of the short pulse may follow the rising edge of control signal for transistor 210, and the width of the short pulse may be very short, such as less than ten nanoseconds. The short pulse may set a logic device that starts the time interval.

In the example of FIG. 10, control circuit 220 charges an internal capacitor during a rising phase of the leading-edge current spike (1006). In the example of FIG. 10, control circuit 220 discharges the internal capacitor during a falling phase of the leading-edge current spike (1008). In the example of FIG. 10, control circuit 220 stops discharging the internal capacitor when the electrical current or shunt voltage begins to increase after the falling phase (1010). In the example of FIG. 10, control circuit 220 detects a valley point of the electrical current based on the second increase in the electrical current through transistor 210 (1012). In the example of FIG. 10, control circuit 220 ends the time interval based on the earlier of the end of the maximum pulse or the valley point of the electrical current (1014). If there is no valley point, or if the valley point occurs relatively late, leading-edge detection unit 230 ends the time interval at the falling edge of the maximum pulse.

The techniques of this disclosure may be implemented in a device or article of manufacture comprising analog circuitry or mixed analog/digital circuitry. The analog circuitry may include passive components, such as resistors, capacitors, inductors, and diodes. In addition or in the alternative, the analog circuitry may include active components, such as transistors and other active devices. Mixed analog/digital circuitry may also include logic gate circuitry made up of switches.

Elements of control circuit 120, control circuit 220, and/or leading-edge detection unit 400 may be implemented in any of a variety of types of solid state circuit elements, such as CPUs, CPU cores, GPUs, digital signal processors (DSPs), application-specific integrated circuits (ASICs), a mixed-signal integrated circuits, field programmable gate arrays (FPGAs), microcontrollers, programmable logic controllers (PLCs), programmable logic device (PLDs), complex PLDs (CPLDs), a system on a chip (SoC), any subsection of any of the above, an interconnected or distributed combination of any of the above, or any other integrated or discrete logic circuitry, or any other type of component or one or more components capable of being configured in accordance with any of the examples disclosed herein. Processing circuitry may also include analog components arranged in a mixed-signal IC.

Control circuit 120, control circuit 220, and/or leading-edge detection unit 400 may include memory. One or more memory devices of the memory may include any volatile or non-volatile media, such as a RAM, ROM, non-volatile RAM (NVRAM), electrically erasable programmable ROM (EEPROM), flash memory, and the like. One or more memory devices of the memory may store computer readable instructions that, when executed by the processing circuitry, cause the processing circuitry to implement the techniques attributed herein to the processing circuitry.

The techniques of this disclosure may be implemented in a wide variety of computing devices. Any components, modules or units have been described to emphasize functional aspects and does not necessarily require realization by different hardware units. The techniques described herein may be implemented in hardware, software, firmware, or any combination thereof. Any features described as modules, units or components may be implemented together in an integrated logic device or separately as discrete but interoperable logic devices. In some cases, various features may be implemented as an integrated circuit device, such as an integrated circuit chip or chipset.

The following numbered examples demonstrate one or more aspects of the disclosure. The examples include reference numerals for leading-edge detection unit 400 of FIG. 4, but other devices and systems may embody and/or perform these examples, including system 100, transistor 110 and 210, control circuits 120 and 220, leading-edge detection unit 230, and blanking unit 240.

EXAMPLE 1

A control circuit is configured to control a transistor, and the control circuit includes a leading-edge detection unit (400) configured to detect a time interval that corresponds to a leading-edge current spike through the transistor, wherein the time interval is independent of temperature. The control circuit also includes a blanking unit configured to prevent the control circuit from turning off the transistor during the time interval.

EXAMPLE 2

The control circuit of example 1, wherein the leading-edge current spike through the transistor includes a rising phase during which an electrical current through the transistor increases and a falling phase during which the electrical current through the transistor decreases. The leading-edge detection unit (400) is configured to detect the time interval by at least starting the time interval when the control circuit turns on the transistor and ending the time interval when the electrical current through the transistor increases after the falling phase.

EXAMPLE 3

The control circuit of examples 1-2 or any combination thereof, wherein the leading-edge detection unit (400) is configured to detect the time interval of less than or equal to a predetermined time duration ($T_{LEB.max}$).

EXAMPLE 4

The control circuit of examples 1-3 or any combination thereof, wherein the control circuit is configured to control the transistor by at least turning on the transistor to initiate the leading-edge current spike. The leading-edge detection unit (400) is further configured to start a timer when the control circuit turns on the transistor and stop the timer after the predetermined time duration ($T_{LEB.max}$). The blanking unit is further configured to refrain from preventing the control circuit from turning off the transistor after the leading-edge detection unit (400) stops the timer.

EXAMPLE 5

The control circuit of examples 1-4 or any combination thereof, herein the leading-edge detection unit (400) includes a capacitor (450). The leading-edge detection unit (400) is further configured to charge the capacitor (450) during a rising phase of the leading-edge current spike, during which an electrical current through the transistor increases. The leading-edge detection unit (400) is also configured to discharge the capacitor (450) during a falling phase of the leading-edge current spike during which the electrical current through the transistor decreases. The leading-edge detection unit (400) is configured to end the time interval when the electrical current through the transistor increases after the falling phase.

EXAMPLE 6

The control circuit of examples 1-5 or any combination thereof, wherein the control circuit is further configured to monitor a shunt voltage ($V_{CS}$) across a resistor electrically connected in series with the transistor. The leading-edge detection unit (400) is configured to charge the capacitor (450) when the shunt voltage ($V_{CS}$) is greater than the voltage across the capacitor (450). The leading-edge detection unit (400) is configured to discharge the capacitor (450) when the shunt voltage ($V_{CS}$) is less than the voltage across the capacitor (450). The leading-edge detection unit (400) is further configured to end the time interval when the shunt voltage ($V_{CS}$) is greater than the voltage across the capacitor (450) after discharging the capacitor (450).

EXAMPLE 7

The control circuit of examples 1-6 or any combination thereof, wherein the leading-edge detection unit (400) further includes at least one comparator (420, 422) and a first logic device (490, 492). The at least one comparator (420, 422) is configured to compare the shunt voltage ($V_{CS}$) and the voltage across the capacitor (450) and generate an output signal based on comparing the shunt voltage ($V_{CS}$) and the voltage across the capacitor (450). The first logic device (490, 492) is configured to start the time interval when the control circuit turns on the transistor and end the time interval when the output signal indicates that the shunt voltage ($V_{CS}$) is greater than the voltage across the capacitor (450) after the falling phase.

EXAMPLE 8

The control circuit of examples 1-7 or any combination thereof, wherein the leading-edge detection unit (400) further includes a second logic device (460) configured to cause the leading-edge detection unit (400) to begin charging the capacitor (450) when the control circuit turns on the transistor. The second logic device (460) is further configured to cause the leading-edge detection unit (400) to refrain from charging the capacitor (450) when the output signal indicates that the shunt voltage ($V_{CS}$) is less than the voltage across the capacitor (450). The leading-edge detection unit (400) also includes a third logic device (462) configured to cause the leading-edge detection unit (400) to begin discharging the capacitor (450) when the output signal indicates that the shunt voltage ($V_{CS}$) is less than the voltage across the capacitor (450). The third logic device (462) is further configured to cause the leading-edge detection unit (400) to refrain from discharging the capacitor (450) when the output signal indicates that the shunt voltage ($V_{CS}$) is greater than the voltage across the capacitor (450).

EXAMPLE 9

The control circuit of examples 1-8 or any combination thereof, wherein the rising phase is a first rising phase. The leading-edge detection unit (400) is further configured to turn on a first switch (430, 432) during the first rising phase to charge the capacitor (450), turn off the first switch (430, 432) during the falling phase, turn off a second switch (440, 442) during the first rising phase, turn on the second switch (440, 442) during the falling phase to discharge the capacitor (450), and turn off the first switch (430, 432) and the second switch (440, 442) during a second rising phase after the falling phase.

EXAMPLE 10

The control circuit of examples 1-9 or any combination thereof, wherein the leading-edge detection unit (400) includes a discharge switch (470) configured to discharge the capacitor (450) when the control circuit turns off the transistor.

EXAMPLE 11

The control circuit of examples 1-10 or any combination thereof, wherein the blanking unit is configured to prevent the control circuit from turning off the transistor during the time interval by at least causing the control circuit to deliver enabling control signals to the transistor during the time interval to cause the transistor to remain on.

EXAMPLE 12

A method includes detecting a time interval that corresponds to a leading-edge current spike through a transistor, wherein the time interval is independent of temperature. The method also includes refraining from turning off the transistor during the time interval.

EXAMPLE 13

The method of example 12, detecting the time interval includes turning on the transistor, starting the time interval in response to turning on the transistor, and ending the time interval when the electrical current through the transistor increases after the falling phase.

EXAMPLE 14

The method of examples 12-13 or any combination thereof, further including turning on the transistor, starting a timer in response to turning on the transistor, stopping the timer after the predetermined time duration ($T_{LEB,max}$), ending the time interval in response to stopping the timer.

EXAMPLE 15

The method of examples 12-14 or any combination thereof, wherein detecting the time interval includes charging a capacitor (450) during a rising phase of the leading-edge current spike, discharging the capacitor (450) during a falling phase of the leading-edge current spike, and ending the time interval at an end of the falling phase.

EXAMPLE 16

The method of examples 12-15 or any combination thereof, further including monitoring a shunt voltage ($V_{CS}$) across a resistor electrically connected in series with the transistor and ending the time interval when the shunt voltage ($V_{CS}$) is greater than a voltage across the capacitor (450) after discharging the capacitor (450). Charging the capacitor (450) during the rising phase includes charging the capacitor (450) when the shunt voltage ($V_{CS}$) is greater than the voltage across the capacitor (450). Discharging the capacitor (450) during the falling phase includes discharging the capacitor (450) when the shunt voltage ($V_{CS}$) is less than the voltage across the capacitor (450).

EXAMPLE 17

The method of examples 12-16 or any combination thereof, further including turning on the transistor, comparing the shunt voltage ($V_{CS}$) and the voltage across the capacitor (450), generating an output signal based on comparing the shunt voltage ($V_{CS}$) and the voltage across the capacitor (450), starting the time interval in response to turning on the transistor, and ending the time interval in response to the output signal indicating that the shunt voltage ($V_{CS}$) is greater than the voltage across the capacitor (450) after the falling phase.

EXAMPLE 18

The method of examples 12-17 or any combination thereof, further including starting to charge the capacitor (450) in response to turning on the transistor, refraining from charging the capacitor (450) in response to the output signal indicating that the shunt voltage ($V_{CS}$) is less than the voltage across the capacitor (450), starting to discharge the capacitor (450) when in response to the output signal indicating that the shunt voltage ($V_{CS}$) is less than the voltage across the capacitor (450), and refraining from discharging the capacitor (450) when the output signal indicates that the shunt voltage ($V_{CS}$) is greater than the voltage across the capacitor (450).

EXAMPLE 19

A power electronics system includes a transistor and a control circuit configured to control the transistor. The control circuit includes a leading-edge detection unit (400) configured to detect a time interval that corresponds to a leading-edge current spike through the transistor, wherein the time interval is independent of temperature. The control circuit further includes a blanking unit configured to prevent the control circuit from turning off the transistor during the time interval.

EXAMPLE 20

The power electronics system of example 19, further including a resistor electrically connected in series with the transistor, wherein the control circuit is further configured to monitor a shunt voltage ($V_{CS}$) across the resistor. The leading-edge detection unit (400) includes a capacitor (450) and is further configured to charge the capacitor (450) when the shunt voltage ($V_{CS}$) is greater than the voltage across the capacitor (450). The leading-edge detection unit (400) is also configured to discharge the capacitor (450) when the shunt voltage ($V_{CS}$) is less than the voltage across the capacitor (450). The leading-edge detection unit (400) is configured to end the time interval when the shunt voltage ($V_{CS}$) is greater than the voltage across the capacitor (450) after discharging the capacitor (450).

In some examples, an electrical connection may be designed to have zero impedance between two or more components. In some examples, even though two components are designed to be electrically connected, there may be a nonzero electrical resistance and/or nonzero electrical impedance between the components. In addition, an electrical connection between two components may include capacitance and/or inductance between the two components. In addition, even though two or more components may be designed to be electrical isolated, there may be a non-infinite electrical resistance and/or non-infinite electrical impedance between the components.

As described herein, a determination that a first value is "less than" a second value may, in some examples, include a determination that the first value is "less than or equal to" the second value, or vice versa. A determination that a first value is "greater than" a second value may, in some examples, include a determination that the first value is "greater than or equal to" the second value, or vice versa.

Various examples of the disclosure have been described. Any combination of the described systems, operations, or functions is contemplated. These and other examples are within the scope of the following claims.

What is claimed is:

1. A control circuit configured to control a transistor, the control circuit comprising:
a leading-edge detection unit configured to detect a time interval that corresponds to a leading-edge current spike through the transistor, wherein the time interval is independent of temperature; and
a blanking unit configured to prevent the control circuit from turning off the transistor during the time interval.

2. The control circuit of claim 1,
wherein the leading-edge current spike through the transistor comprises:
a rising phase during which an electrical current through the transistor increases; and
a falling phase during which the electrical current through the transistor decreases, and
wherein the leading-edge detection unit is configured to detect the time interval by at least:
starting the time interval when the control circuit turns on the transistor; and
ending the time interval when the electrical current through the transistor increases after the falling phase.

3. The control circuit of claim 1, wherein the leading-edge detection unit is configured to detect the time interval of less than or equal to a predetermined time duration.

4. The control circuit of claim 3,
wherein the control circuit is configured to control the transistor by at least turning on the transistor to initiate the leading-edge current spike,
wherein the leading-edge detection unit is further configured to:
start a timer when the control circuit turns on the transistor; and
stop the timer after the predetermined time duration, and
wherein the blanking unit is further configured to refrain from preventing the control circuit from turning off the transistor after the leading-edge detection unit stops the timer.

5. The control circuit of claim 1,
wherein the leading-edge detection unit comprises a capacitor,
wherein the leading-edge detection unit is further configured to:
charge the capacitor during a rising phase of the leading-edge current spike, during which an electrical current through the transistor increases;
discharge the capacitor during a falling phase of the leading-edge current spike during which the electrical current through the transistor decreases; and end the time interval when the electrical current through the transistor increases after the falling phase.

6. The control circuit of claim 5,
wherein the control circuit is further configured to monitor a shunt voltage across a resistor electrically connected in series with the transistor,
wherein the leading-edge detection unit is configured to charge the capacitor when the shunt voltage is greater than the voltage across the capacitor,
wherein the leading-edge detection unit is configured to discharge the capacitor when the shunt voltage is less than the voltage across the capacitor, and
wherein the leading-edge detection unit is further configured to end the time interval when the shunt voltage is greater than the voltage across the capacitor after discharging the capacitor.

7. The control circuit of claim 6,
wherein the leading-edge detection unit further comprises at least one comparator and a first logic device,
wherein the at least one comparator is configured to:
compare the shunt voltage and the voltage across the capacitor; and
generate an output signal based on comparing the shunt voltage and the voltage across the capacitor,
wherein the first logic device is configured to:
start the time interval when the control circuit turns on the transistor; and
end the time interval when the output signal indicates that the shunt voltage is greater than the voltage across the capacitor after the falling phase.

8. The control circuit of claim 7, wherein the leading-edge detection unit further comprises:
a second logic device configured to:
cause the leading-edge detection unit to begin charging the capacitor when the control circuit turns on the transistor;
cause the leading-edge detection unit to refrain from charging the capacitor when the output signal indicates that the shunt voltage is less than the voltage across the capacitor; and
a third logic device configured to:
cause the leading-edge detection unit to begin discharging the capacitor when the output signal indicates that the shunt voltage is less than the voltage across the capacitor; and
cause the leading-edge detection unit to refrain from discharging the capacitor when the output signal indicates that the shunt voltage is greater than the voltage across the capacitor.

9. The control circuit of claim 5, wherein the rising phase is a first rising phase, and wherein the leading-edge detection unit is further configured to:
turn on a first switch during the first rising phase to charge the capacitor;
turn off the first switch during the falling phase;
turn off a second switch during the first rising phase;
turn on the second switch during the falling phase to discharge the capacitor; and
turn off the first switch and the second switch during a second rising phase after the falling phase.

10. The control circuit of claim 1, wherein the leading-edge detection unit comprises:
a capacitor; and
a discharge switch configured to discharge the capacitor when the control circuit turns off the transistor.

11. The control circuit of claim 1, wherein the blanking unit is configured to prevent the control circuit from turning off the transistor during the time interval by at least causing the control circuit to deliver enabling control signals to the transistor during the time interval to cause the transistor to remain on.

12. A method comprising:
detecting a time interval that corresponds to a leading-edge current spike through a transistor, wherein the time interval is independent of temperature; and
refraining from turning off the transistor during the time interval.

13. The method of claim 12,
wherein the leading-edge current spike through the transistor comprises a rising phase during which an electrical current through the transistor increases and a falling phase during which the electrical current through the transistor decreases, and
wherein detecting the time interval comprises:
turning on the transistor;
starting the time interval in response to turning on the transistor; and
ending the time interval when the electrical current through the transistor increases after the falling phase.

14. The method of claim 12, further comprising:
turning on the transistor;
starting a timer in response to turning on the transistor;
stopping the timer after a predetermined time duration;
ending the time interval in response to stopping the timer.

15. The method of claim 12, wherein detecting the time interval comprises:
charging a capacitor during a rising phase of the leading-edge current spike;
discharging the capacitor during a falling phase of the leading-edge current spike; and
ending the time interval at an end of the falling phase.

16. The method of claim 15, further comprising:
monitoring a shunt voltage across a resistor electrically connected in series with the transistor; and
ending the time interval when the shunt voltage is greater than a voltage across the capacitor after discharging the capacitor,
wherein charging the capacitor during the rising phase comprises charging the capacitor when the shunt voltage is greater than the voltage across the capacitor, and
wherein discharging the capacitor during the falling phase comprises discharging the capacitor when the shunt voltage is less than the voltage across the capacitor.

17. The method of claim 16, further comprising:
turning on the transistor;
comparing the shunt voltage and the voltage across the capacitor;
generating an output signal based on comparing the shunt voltage and the voltage across the capacitor;
starting the time interval in response to turning on the transistor; and
ending the time interval in response to the output signal indicating that the shunt voltage is greater than the voltage across the capacitor after the falling phase.

18. The method of claim 17, further comprising:
starting to charge the capacitor in response to turning on the transistor;
refraining from charging the capacitor in response to the output signal indicating that the shunt voltage is less than the voltage across the capacitor;

starting to discharge the capacitor in response to the output signal indicating that the shunt voltage is less than the voltage across the capacitor; and refraining from discharging the capacitor when the output signal indicates that the shunt voltage is greater than the voltage across the capacitor.

19. A power electronics system comprising:

a transistor;

a control circuit configured to control the transistor, wherein the control circuit includes:
 - a leading-edge detection unit configured to detect a time interval that corresponds to a leading-edge current spike through the transistor, wherein the time interval is independent of temperature; and
 - a blanking unit configured to prevent the control circuit from turning off the transistor during the time interval.

20. The power electronics system of claim 19, further comprising a resistor electrically connected in series with the transistor, wherein the control circuit is further configured to monitor a shunt voltage across the resistor, wherein the leading-edge detection unit comprises a capacitor, and wherein the leading-edge detection unit is further configured to:
 - charge the capacitor when the shunt voltage is greater than the voltage across the capacitor;
 - discharge the capacitor when the shunt voltage is less than the voltage across the capacitor; and
 - end the time interval when the shunt voltage is greater than the voltage across the capacitor after discharging the capacitor.

* * * * *